United States Patent [19]
Takahashi et al.

[11] Patent Number: 5,477,154
[45] Date of Patent: Dec. 19, 1995

[54] AN EDP CHECKER INCLUDING A MATCHING CIRCUIT

[75] Inventors: Kumio Takahashi; Shun Suzuki; Toshiaki Koizumi, all of Katsuta, Japan

[73] Assignee: Hitachi Koki Co., Ltd., Tokyo, Japan

[21] Appl. No.: 269,377

[22] Filed: Jun. 30, 1994

[30] Foreign Application Priority Data

Jun. 30, 1993 [JP] Japan ................................. 5-162364

[51] Int. Cl.$^6$ ................................................. G01R 29/08
[52] U.S. Cl. ........................... 324/628; 324/529; 340/657
[58] Field of Search ................................. 324/508, 510, 324/511, 529, 530, 628, 772, 127, 102; 340/635, 657, 658; 333/12, 181, 185

[56] References Cited

U.S. PATENT DOCUMENTS

| | | | |
|---|---|---|---|
| 4,011,483 | 3/1977 | Meadows | 324/510 X |
| 4,739,274 | 4/1988 | Kimball et al. | 324/529 |
| 4,973,911 | 11/1990 | Marshall | 324/628 |

FOREIGN PATENT DOCUMENTS 4-5147  1/1992  Japan .

Primary Examiner—Kenneth A. Wieder
Assistant Examiner—Diep Do
Attorney, Agent, or Firm—Sughrue, Moion, Zinn, Macpeak & Seas

[57] ABSTRACT

An electromagnetic disturbance power (EDP) checker measures disturbance waves of an equipment under test (EUT), that is, a small electric appliance having a power cord. The EDP checker is capable of detecting and measuring disturbance waves even in sites more confined and having more external disturbance waves than in absorbing clamp method. The EDP checker includes a VHF current probe 2, a matching circuit 3 having input impedance matched at a reception frequency of a measuring equipment (receiver) 6 connected to the VHF current probe 2, and a circuit separating mains 4 for designating terminal impedance of the matching circuit 3 and eliminating influence of power source impedance. Power is supplied from the circuit separating mains 4 to drive the EUT 5 connected to the VHF current probe 2. The maximum value of disturbance power generated by the EUT 5 and supplied through the power cord 12 is measured by the measuring equipment 6 connected to the VHF current probe 2.

6 Claims, 6 Drawing Sheets

AN EDP CHECKER INCLUDING A MATCHING CIRCUIT

BACKGROUND OF THE INVENTION

1. Field of the Invention

The present invention relates to an electromagnetic disturbance power (EDP) checker, and more particularly to an EDP checker for measuring high-frequency electromagnetic disturbance generated from a small electric appliance such as an electric tool having a power cord or a main lead.

2. Description of the Prior Art

Electromagnetic disturbance waves having frequencies of 30 MHz or more are radiated from a small electric appliance. As methods of measuring the level of such radiation, there has been known an electric field strength measuring method and an absorbing clamp method. In the former method, the disturbance waves radiated from an electric appliance (hereinafter referred to as "EUT" as an abbreviation for "equipment under test") are measured directly using an antenna. In the latter method, electromagnetic disturbance waves radiated from a power cord is measured using an absorbing clamp. The absorbing clamp method is adopted to regulate the disturbance waves.

There has been known problems with directly measuring the electric field strength using the electric field strength measuring method in that the site where measurements are taken must have few external electric waves and must be an ellipsoidal area with a longest radius that is two times the measuring distance and a shortest radius that is $3^{1/2}$ times the measuring distance. Further, a reception antenna must be installed to be raised and lowered in a range from one to four meters in order to maximize the level of the received electric field strength. There has been known another problem in the electric field strength measuring method that repeatability is poor and the measured value obtained from measuring EUT varies greatly by the way the power cords are handled.

Experience has shown that almost all radiation of disturbance waves from EUT comes from the electric power cord. The absorbing clamp method is developed based on this fact and is different from the electric field strength measuring method in that the test site need be only about two meters high by seven meters wide by three meters deep. Also, repeatability of measurements in the absorbing clamp method is excellent. However, a test site with few external electric waves is necessary.

FIG. 1 shows the arrangement of equipment used in the absorbing clamp method and FIG. 2 shows the structure of an absorption clamp which is one of the essential equipment used in the clamp absorbing method. As shown in FIG. 1, measurement by way of the absorbing clamp method is performed in a radio wave shield room 20, with the above-described dimensions, for negating influence from reflection of disturbance waves radiated from EUT and influence of external disturbance waves. Typically, the EUT 5 is positioned about one meter from the metal floor and separated from an adjacent wall surface by 45 cm or more. An electric power cord 12 connected to EUT 5 is stretched tight about one meter above the floor and clamped with the absorbing clamp 19. The output from the power cord 12 is sent through a coaxial cable 13 to measuring equipment 6 which is typically a receiver. A frequency of the electromagnetic wave to be measured is set in the measuring equipment 6. The absorbing clamp 19 is moved along the power cord 12 toward and away from the EUT 5 while clamping the electric power cord 12 until a maximum level for the set frequency is indicated by the measuring equipment 6. Measurements are taken at a position where the measuring equipment 6 indicates the maximum level.

As shown in FIG. 2, the absorbing clamp 19 includes a very high frequency (VHF) current probe 2 which clamps the electric power cord 12, a row of toroidal ferrite cores 21 for use in clamping the electric power cord 12, and another row of toroidal ferrite cores 22 for use in clamping a coaxial cable 13 connected to the VHF current probe 2 for deriving the output of the VHF current probe 2. The row of ferrite cores 21 are provided for absorbing disturbance waves supplied to the power cord 12 from the EUT 5. The row of ferrite cores 22 are provided for absorbing a surface current flowing in the coaxial cable 13.

To measure the disturbance power, the absorbing clamp 19 is moved until the level indicated by the measuring equipment 6 is maximized. The position of the absorbing clamp 19 where the level of the disturbance power is at maximum corresponds to the highest level of the disturbance waves supplied from the EUT 5 to the power cord 12. The length of power cord 12 between the EUT 5 and the absorbing clamp 19 is represented by the sum of the power cord length corresponding to the electric length for one quarter the wavelength of the measuring frequency and the power cord length corresponding to the electric length for the impedance of the EUT 5.

According to the absorbing clamp method described above, the power cord 12 must have a length at least equal to the sum of one quarter the wavelength of the measuring frequency, the electric length corresponding to the impedance of the EUT 5 (i.e., one quarter the wavelength of the maximum measuring frequency), a length needed to confirm that the maximum value was exceeded, and the length of the absorption clamp 19. For example, about seven meters long power cord 12 is necessary to measure 30 MHz disturbance wave, thus a measuring site with dimensions to accommodate the seven meters long power cord 12 is necessary.

Because the length of the row of ferrite cores 21 clamping the power cord 12 is not variable and the position of the row of ferrite cores 21 is fixed relative to the position of the VHF current probe 2, the absorbing clamp 19 is moved for the purpose of maximizing the level of the disturbance power and such a long measuring site as about seven meter long in the case of measuring 30 MHz disturbance wave is necessary. Treating the power cord 12 as a distributed constant circuit, the impedance of the terminal load in the distributed constant circuit can not be changed and a current is measured at a position just before the terminal load, so the measurement is performed upon matching dependent on the length of the power cord 12 between the EUT 5 and the absorbing clamp 19.

SUMMARY OF THE INVENTION

In view of the foregoing, it is an object of the present invention to provide an EDP checker which is usable in a small space such as a space available in a manufacturing line where small electric appliances are manufactured and which can perform measurement correlated to the measurement according to an absorbing clamp method.

In the prior art, a matching condition is established by the length of the power cord of the EUT. In the present invention the VHF current probe is placed close to the EUT. The EUT is constructed so that matching is obtained by a matching circuit with impedance adjusted for maximizing the disturbance power supplied through the power cord. With this configuration, newly introduced influence of impedance from a power source is eliminated by a power source separation circuit.

Also, because the matching circuit supplied power to the EUT to drive the same, the matching circuit requires a plurality of power cords through which the current from the power source flows. For this reason, a separate matching circuit could be provided for each power cord. However providing a separate matching circuit for each power cord might increase error from different characteristics of the individual matching circuits or from differences in influence from the current flowing from the power source. Further, influence is also received from balance disturbance waves that are propagated in the power cord. To solve these problems, considering that the transmission condition of the measured disturbance waves is an imbalanced transmission, the matching circuit is made from a power source supply line; a coupled transformer having a third coil for coupling the high frequencies of the power source supply line; and a capacitor connected to the third coil and adjusted so as to resonate at the reception frequency of the receiver connected to the VHF current probe. Power current does not flow in the third coil of the coupled transformer and the above-mentioned problems do not occur because there is only one matching circuit.

Further, coupling by a coupled transformer having a third coil at the might be insufficient because of differences in the local distribution capacitance and leakage flux from the third coil and the power cord. To solve this problem, the power cord is passed through a metal tube or through the interior of a reticular metal tube so that leakage flux or differences in the local distribution capacitance are not generated. A coupled transformer with a metal tube or a reticular metal tube as the third coil is used.

On the other hand, handling the power cord of the EUT in this way can cause errors. To solve this problem, so that the disturbance power supplied to the detector from the EUT is maximized and so that measurement have experimental repeatability, a line formed by folding the power cord of the EUT in two is made so that it will not separate when folded again.

The VHF current probe is placed close to the EUT. The VHF current flowing into the matching circuit is measured. The VHF current flowing into the matching circuit is maximized by adjusting the input impedance of the matching circuit. As a result, the measurement position (the position of the absorbing clamp) does not need to be adjusted along the length of the power cord and there is no need to extend the power cord about one meter above the floor. In this way, there is no power cord extended like an antenna. Therefore, induced electromotive force is not generated by external disturbance power and detection can be made in environments with a comparatively large amount of disturbance waves. The checker also becomes more compact as a result.

BRIEF DESCRIPTION OF THE DRAWINGS

The particular features and advantages of the invention as well as other objects will become apparent from the following description taken in connection with the accompanying drawings, in which.

DETAILED DESCRIPTION OF THE PREFERRED EMBODIMENTS

Figure 1:
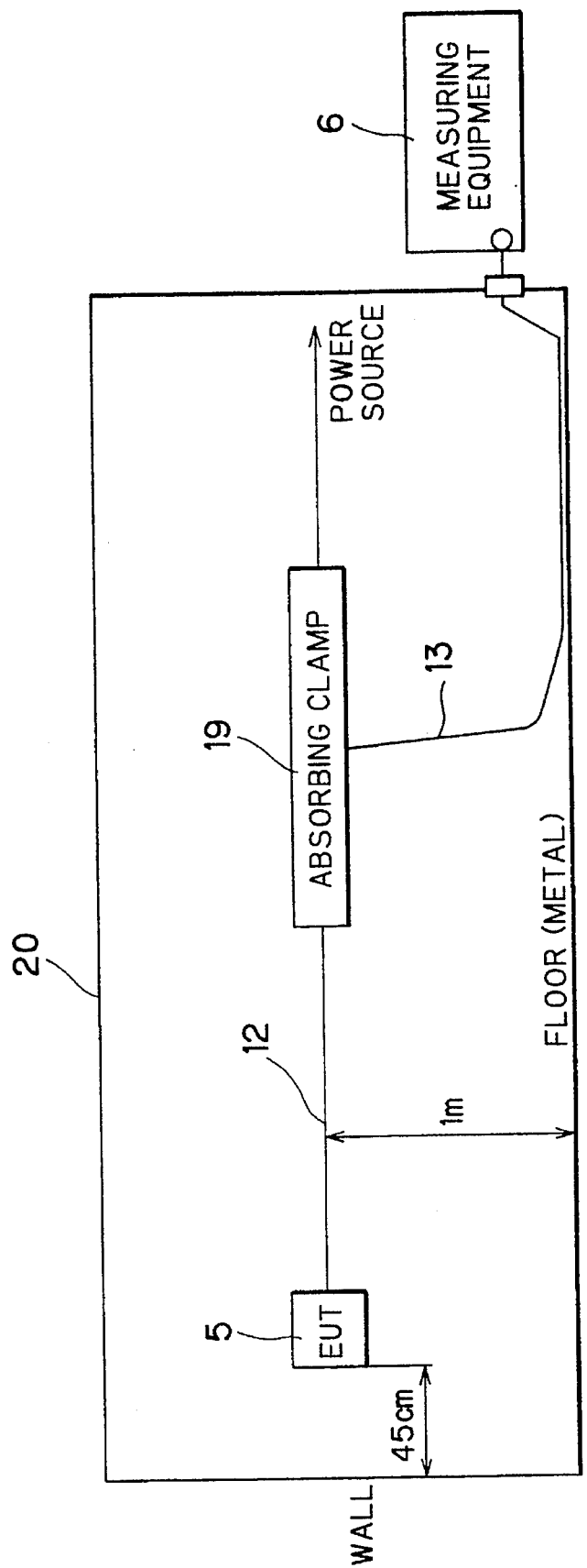
FIG. 1 is a schematic view showing an arrangement of equipment when disturbance power is measured using an absorbing clamp.
Figure 2:
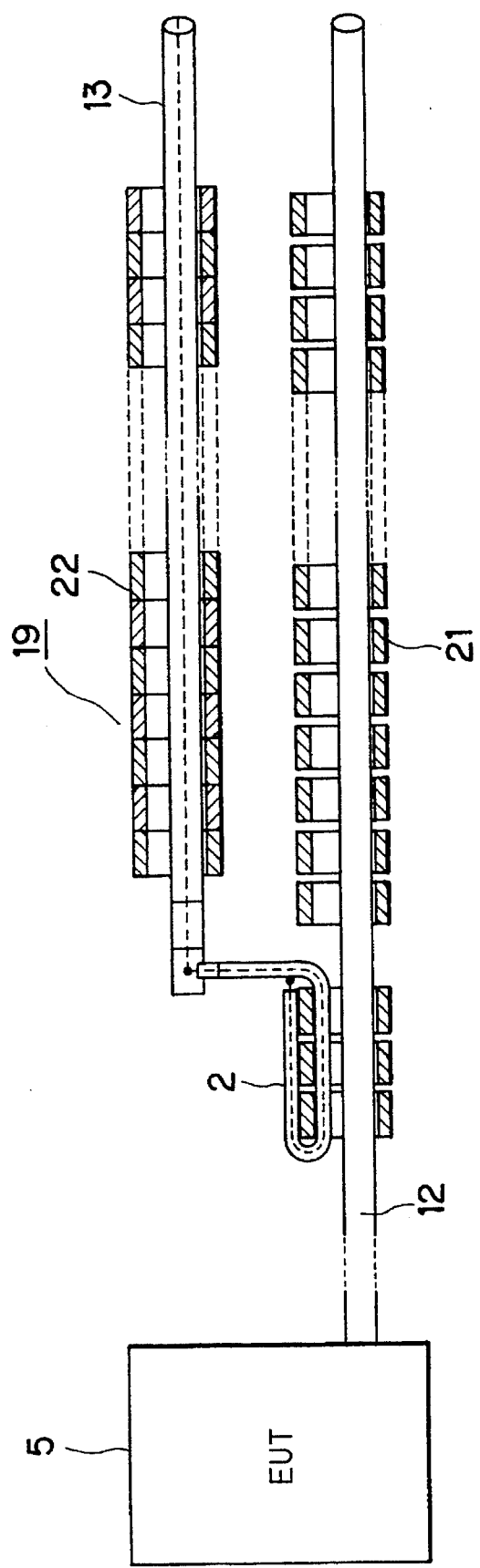
FIG. 2 is a cross-sectional view showing a construction of an absorbing clamp.

A preferred embodiment of the present invention will now be described with reference to the accompanying drawings. In the drawings, FIG. 3 shows a circuit diagram of the embodiment of the present invention, FIG. 4 shows construction of a coupled transformer in a matching circuit, FIG. 5 shows overall construction, and FIGS. 6A through 6E show an example of how the power cord of the EUT is folded.

Figure 3:
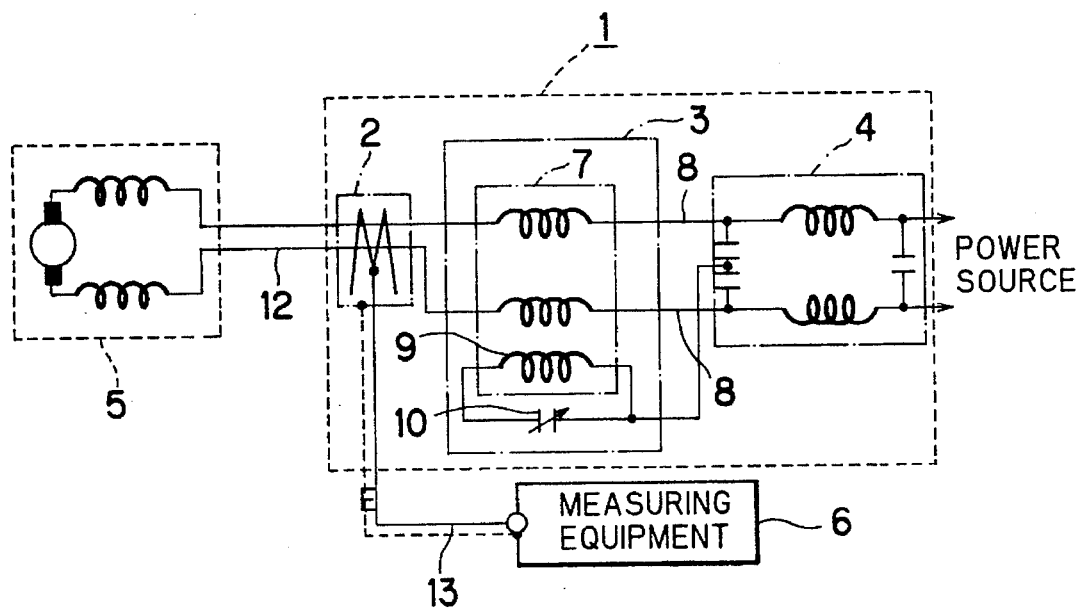
FIG. 3 is a circuit diagram showing an embodiment of the present invention.

In FIG. 3, disturbance waves generated at the EUT 5 pass through the power cord 12 and are supplied to an EDP checker 1. The EDP checker 1 includes a VHF current probe 2, a matching circuit 3, and a circuit separating mains (power source separation circuit) 4. The circuit separating mains 4 is provided for blocking disturbance waves that flow from the power source and for designating the terminal impedance of the matching circuit 3. So that the matching circuit 3 side and the EUT 5 side are in an impedance matched condition as viewed from the VHF current probe 2, the impedance of the matching circuit 3 as viewed from the VHF current probe 2 is set or determined in advance. Then, the disturbance wave supplied to the EDP checker 1 from the EUT 5 is consumed at the impedance of the matching circuit 3. As a result, no reflection of the disturbance wave back to the EUT 5 side occurs and thus the EUT 5 and the matching circuit 3 are placed in a matching condition. Under the matching condition between the EUT 5 and the matching circuit 3, the VHF current flowing into the matching circuit 3 from the EUT 5 shows the maximum value of the disturbance wave. Such VHF current is detected by the VHF current probe 2 and measured by a measuring equipment (or receiver) 6 connected to the VHF current probe 2. From the foregoing, it can be appreciated that the method of detecting and measuring the disturbance wave according to the present invention is equivalent to that of absorbing clamp method.

As shown in FIG. 3, the matching circuit 3 is constructed from a coupled transformer 7 having two power supply lines 8 and a third coil 9, and a variable capacitor 10 connected in series to the third coil 9. The coupled transformer 7 is configured so that unbalanced disturbance waves propagated through the two power supply lines 8 are coupled at the third coil 9. The impedance of the matching circuit 3 as viewed from the VHF current probe 2 is determined by the unbalanced impedance of the circuit separating mains 4 as viewed from the matching circuit 3 and the unbalanced impedance of the two power supply lines 8. However, because the third coil 9 is coupled to the two power supply lines 8, the impedance of the matching circuit 3 as viewed from the VHF current probe 2 is adjustable to some extent by changing the electrostatic capacitance of the capacitor connected to the third coil 9.

Figure 4:
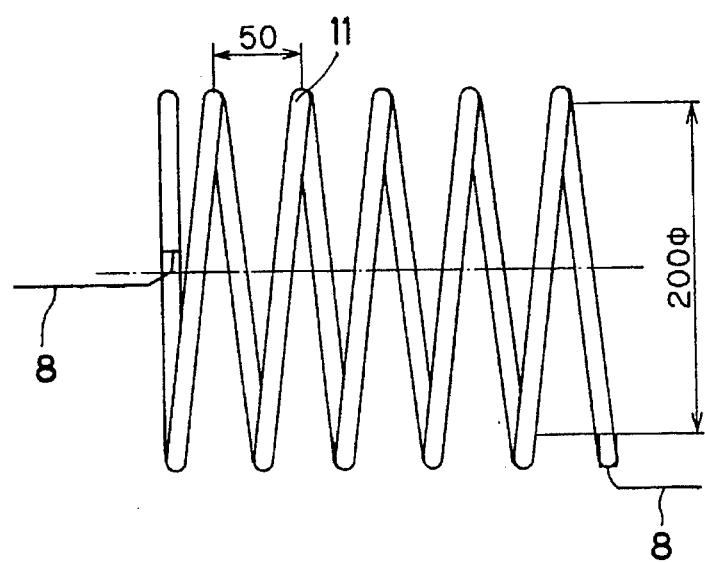
FIG. 4 is a frontal view showing a coupled transformer of a matching circuit.
Figure 5:
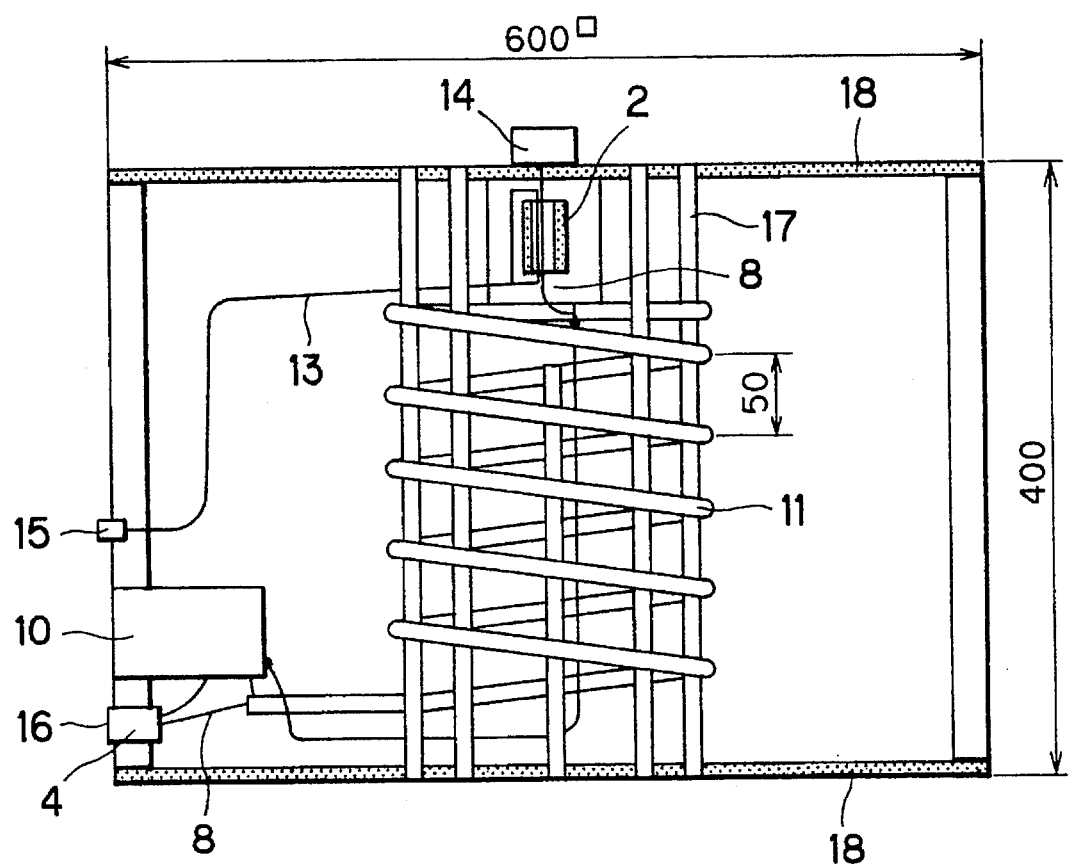
FIG. 5 is a frontal view showing an embodiment of a detector according to the present invention.

FIG. 4 shows the configuration of the coupled transformer of the matching circuit 3. If the third coil 9 and the two power supply lines 8 of the coupled transformer 7 are not in coaxial configuration, coupling between the third coil 9 and the power supply lines 8 cannot be achieved due to differences in the distribution capacity of the two which are coupled and leakage magnetic flux of each coil. As shown in FIG. 4, according to the embodiment of the present invention, a metal tube 11 is used for the third coil 9 and the two power supply lines 8 are passed through the metal tube 11. With such a configuration, the distance between the inner surface of the metal tube 11 and the two power supply lines 8 is substantially constant. Therefore, the distribution capacity between the metal tube 11 and the two power supply lines 8 is locally constant and leakage magnetic flux is not imbalanced. The above described advantages can be further increased by twisting the two power supply lines 8 at the interior of the metal tube 11 together. This is because, twisting the two power supply lines together causes the balanced disturbance waves propagated through the two power supply lines 8 to negate themselves so that only the imbalanced disturbance waves become coupled.

FIG. 5 shows construction of a concrete example of the circuit shown in FIG. 3. The EUT 5 is placed on the upper portion of the platform 18 and the power cord 12 of the EUT 5 is connected to an outlet 14. The receiver or measuring equipment 6 is connected to a connector 15 using a coaxial cable and power is supplied thereto from another outlet 16. The support beams 17 are provided for supporting the metal tube 11 in a coil shape.

Figure 6A:
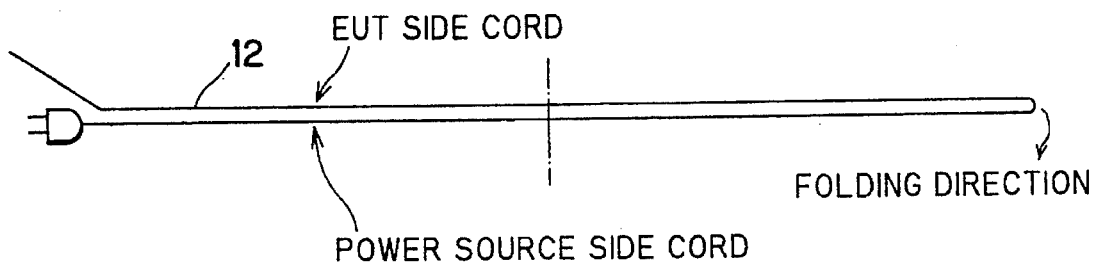
FIGS. 6A through 6E are explanatory diagrams showing an example of folding treatment for a power cord of an EUT.
Figure 6B:
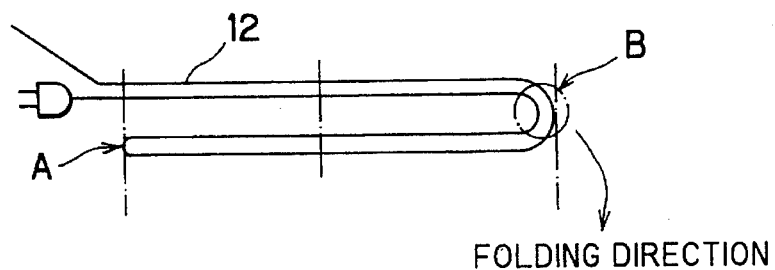
Figure 6C:
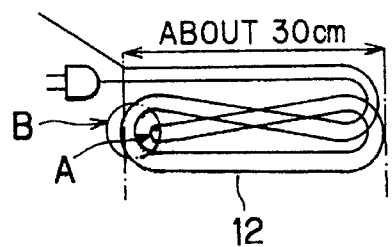
Figure 6D:
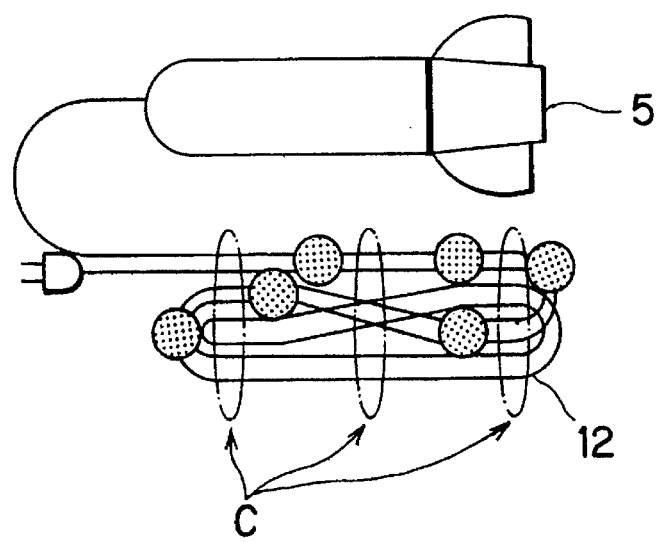
Figure 6E:
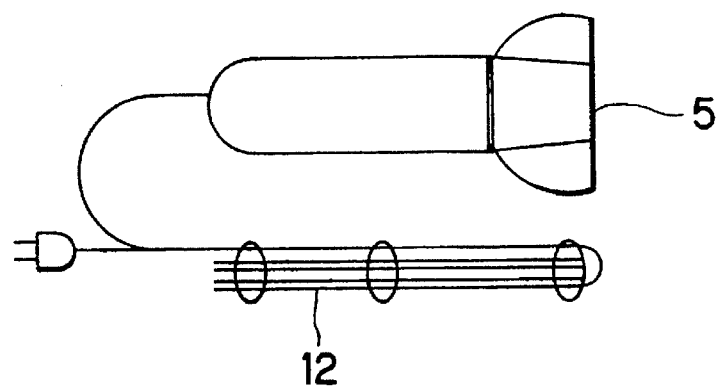

FIGS. 6A through 6E show an example of a forming process of the power cord 12 of the EUT 5. Typically, the power cord 12 has a length in a range from one to several meters. Normally, the power cord 12 cannot be detached from the EUT 5. The EUT side impedance as viewed from the EDP checker 1 might change because the power cord 12 runs between the EUT 5 and the EDP checker 1. In such a case, the matching condition cannot be maintained and thus the disturbance waves supplied from the EUT 5 to the EDP checker 1 does not indicate the maximum value. According to the embodiment of the present invention, the EUT side cord and the power source side cord are folded in two as shown in FIG. 6A, and the folded power cord 12 is again folded in two as shown in FIG. 6B. The thus folded power cord 12 is once again folded in two as shown in FIG. 6C so that the portions A and B do not overlap, with the result that the length of the folded power cord becomes about 30 centimeters. As shown in FIG. 6D, three portions of the folded power cord indicated by letter C are bundled by a strand so as not to separate. At this time, the two cords at portions indicated in FIG. 6D by circles with dots inside are arranged adjacent to each other. By so doing, an amount of disturbance waves directly propagated to the power source side code from the EUT side code increases because the power source side cord and the EUT side code are always separated by a short distance. For the same reason, the impedance from the EUT side cord to the power source side cord lowers attendant to an increase of the distribution capacity. For this reason, effects of the section of the power cord 12 existing between the EUT 5 and the EDP checker 1 are reduced.

Even if the power cord 12 is, for example, extended in a straight line or bent at a designated point to have predetermined dimensions, repeatability of measured values are achieved. However, the area of the site required for arranging the power cord 12 increases. Also, the electric length corresponding to the impedance of the EUT 5 side as viewed from the EDP checker 1 increases so that the matching condition is influenced by the condition of the power cord 12 attached to the EUT 5.

Although the present invention has been described with respect to a specific embodiment, it will be appreciated by one skilled in the art that a variety of changes and modifications may be made without departing from the scope of the invention. For example, certain features may be used independently of others and equivalents may be substituted all within the spirit and scope of the invention. Particularly, the terminal impedance of the matching circuit can be replaced with a specific low resistance load. As a modification of the present invention, the matching circuit can be replaced with a distributed constant circuitry using a stub circuit or a combination of the ferrite cores and, for example, a coaxial filter.

According to the present invention, although using electrical phenomenon equivalent to conventional absorbing clamps, there is no need to stretch the power cord one meter above the floor. Therefore, measurement can be performed in a small test site and in an environment comparatively high in external disturbance waves without influence from the external disturbance waves. The configuration of the detector can be simplified because there is no need to attach a matching circuit to each electric power cord. Also, influence from balanced disturbance waves propagated between the power cord can be eliminated. Also, errors from leakage magnetic flux and local distribution capacity differences can be eliminated. Further, measurement can be made with the power cord attached to the EUT because the influence of the power cord that is attached to the EUT and that runs between the EUT and the EDP checker can be omitted.

What is claimed is:

1. An electromagnetic disturbance power checker for detecting and measuring disturbance power coming from an equipment under test to which a power supply cord is connected, said power supply cord having a plug connectable to a power source, said power source having a power source impedance, comprising:

a VHF current probe, electrically disposed in association with said power supply cord, which detects a VHF current in said power supply cord;

a receiver connected to said VHF current probe, via a cable, to receive a detected VHF current and which sets a reception frequency in said receiver;

a matching circuit having an input impedance matched at the reception frequency of said receiver; and a power supply separating circuit connected between said matching circuit and said power source, said power supply separating circuit designating a terminal impedance of said matching circuit and eliminating influence of the power source impedance;

wherein a maximum level of disturbance power generated by the equipment under test and supplied to the power supply cord is measured by said receiver based Upon said VHF current.

2. The electromagnetic disturbance power checker according to claim 1, wherein said matching circuit comprises a coupled transformer coupled to two lines of said power supply cord and a coil high-frequency coupled to the two lines of said power supply cord, and a capacitor connected to said coil, an electrostatic capacitance of said capacitor being adjustable so as to resonate at the reception frequency set in said receiver.

3. An electromagnetic disturbance power checker according to claim 2, wherein said coil of said coupled transformer comprises a cylindrical tube made of metal, said power supply cord being passed through said cylindrical tube.

4. An electromagnetic disturbance power checker according to claim 3, wherein said power supply cord comprises two lines twisted at an interior of said cylindrical tube.

5. An electromagnetic disturbance power checker according to claim 2, wherein said coil of said coupled transformer comprises a reticular metal tube, said power supply cords being passed through said reticular metal tube.

6. An electromagnetic disturbance power checker according to claim 1, further comprising means for securing said power supply cord so that adjoining portions of said power supply cord when said power supply cord is folded in two do not separate when the folded power supply cord is again folded in two.

\* \* \* \* \*